United States Patent [19]
Motoda et al.

[11] Patent Number: 5,741,359
[45] Date of Patent: Apr. 21, 1998

[54] METHOD AND APPARATUS FOR ZONE-MELTING RECRYSTALLIZATION OF SEMICONDUCTOR LAYER

[75] Inventors: Takashi Motoda; Manabu Kato, both of Itami, Japan

[73] Assignee: Mitsubishi Denki Kabushiki Kaisha, Tokyo, Japan

[21] Appl. No.: 524,776

[22] Filed: Sep. 7, 1995

[30] Foreign Application Priority Data

Sep. 8, 1994 [JP] Japan ................... 6-214567

[51] Int. Cl.$^6$ ................... C30B 13/06
[52] U.S. Cl. ................... 117/43; 117/44; 117/45; 117/46; 117/219; 117/222; 117/904
[58] Field of Search ................... 117/43, 44, 45, 117/46, 219, 222, 904

[56] References Cited

U.S. PATENT DOCUMENTS

| | | | |
|---|---|---|---|
| 4,406,709 | 9/1983 | Celler et al. | 117/904 |
| 4,479,846 | 10/1984 | Smith et al. | 117/43 |
| 4,549,913 | 10/1985 | Hayafuji et al. | 117/43 |
| 4,585,512 | 4/1986 | Hayafuji et al. | 117/44 |
| 4,737,233 | 4/1988 | Kamgar et al. | 117/43 |
| 4,861,418 | 8/1989 | Nishimura et al. | 117/44 |
| 4,915,772 | 4/1990 | Fehlner et al. | 117/43 |

FOREIGN PATENT DOCUMENTS

| | | |
|---|---|---|
| 62-113090 | 6/1987 | Japan . |
| 62-12309 | 6/1987 | Japan . |
| 2152222 | 6/1990 | Japan . |
| 521340 | 1/1993 | Japan . |
| 556314 | 8/1993 | Japan . |
| 556315 | 8/1993 | Japan . |

OTHER PUBLICATIONS

Knapp et al., "Growth of Si on Insulators Using Electron Beams", Journal of Crystal Growth, vol. 63, No. 3, Oct. 1, 1983, pp. 445–452.

Susumu Namba, "Crystallization of Vacuum-Evaporated Germanium Films by the Electron-Beam Zone-Melting Process", Journal of Applied Physics, vol. 37, No. 4, Mar. 15, 1996, pp. 1929–1930.

*Primary Examiner*—Robert Kunemund
*Attorney, Agent, or Firm*—Leydig, Voit & Mayer, Ltd.

[57] ABSTRACT

An apparatus for zone-melting recrystallization of a semiconductor layer includes a first heater, on which a semiconductor wafer including the semiconductor layer and upper and lower insulating films sandwiching the semiconductor layer is mounted, for radiantly heating a rear surface of the semiconductor wafer to a temperature at which the semiconductor layer and the insulating layers are not melted; and a second heater disposed above the semiconductor wafer and radiantly heating a front surface of the semiconductor wafer. The second heater has a heat generating point that produces a heated spot in the semiconductor layer and moves spirally while maintaining a fixed distance from the semiconductor wafer, thereby producing a large-area monocrystalline region in the semiconductor layer. In this zone-melting recrystallization, a single crystalline nucleus is produced in the semiconductor layer, and the entire semiconductor layer is recrystallized with the crystalline nucleus as a seed crystal. Therefore, the semiconductor layer is recrystallized with the same crystal structure and orientation as the crystalline nucleus, so that grain boundaries are reduced, resulting in a semiconductor layer with increased grain size.

14 Claims, 11 Drawing Sheets

METHOD AND APPARATUS FOR ZONE-MELTING RECRYSTALLIZATION OF SEMICONDUCTOR LAYER

FIELD OF THE INVENTION

The present invention relates to methods and apparatus for zone-melting recrystallization of semiconductor layers that can reduce grain boundaries or control positions where grain boundaries are produced and that can provide semiconductor layers with increased grain size, i.e., increased monocrystalline regions.

BACKGROUND OF THE INVENTION

In order to improve electrical characteristics of a semiconductor layer, such as conductivity, zone-melting recrystallization for increasing a monocrystalline region, i.e., grain size, in the semiconductor layer has conventionally been employed.

FIG. 18 is a perspective view illustrating an apparatus for zone-melting recrystallization of a semiconductor wafer. In FIG. 18, a semiconductor wafer 1 is disposed on a carbon plate heater 2. A strip carbon heater 3 is positioned above the semiconductor wafer 1 and moved across the wafer 1 in the direction indicated by an arrow 3a at a uniform rate. FIG. 19 is a sectional view of the semiconductor wafer 1 shown in FIG. 18. The semiconductor wafer 1 comprises an insulating substrate 4 comprising quartz or the like, a polycrystalline or amorphous semiconductor layer 5 comprising silicon or the like and disposed on the insulating substrate 4, and an insulating film 6 comprising $SiO_2$ or the like and disposed on the semiconductor layer 5. A silicon substrate on which an insulating film, such as $SiO_2$, is deposited may be used for the insulating substrate 4 of the semiconductor wafer 1.

A description is given of the zone-melting recrystallization process.

Initially, the semiconductor wafer 1 is placed on the carbon plate heater 2 and preheated. Then, the strip carbon heater 3 is positioned above the semiconductor wafer 1 and moved across the wafer 1 in the arrow direction 3a at a uniform rate. With the movement of the strip carbon heater 3, a strip zone of the semiconductor layer 5 heated by the strip carbon heater 3 is melted and, after the heater 3 has passed, the molten zone is resolidified and recrystallized. In this way, the zone-melting recrystallization proceeds from one side of the semiconductor layer 5 toward the opposite side thereof.

The zone-melting recrystallization will be described in more detail using FIG. 20. In FIG. 20, reference character M denotes a region being heated by the strip carbon heater 3 and melted, reference character P denotes a polycrystalline or amorphous region that has not yet been melted, and reference character RC is a monocrystalline region obtained after the molten region has resolidified by spontaneous cooling and recrystallized. In addition, reference character a denotes a position intermediate the region P and the region M, and reference character b denotes a position intermediate the region M and the region RC. The abscissa of the graph shows the position of the carbon heater 3 in the moving direction 3a, and the ordinate shows the temperature. Reference characters $T_S$ and $T_M$ on the ordinate denote the preheating temperature of the plate carbon heater 2 and the melting point of the semiconductor layer 5, respectively. As can be seen from FIG. 20, the heated region of the semiconductor layer 5 is shifted with the movement of the strip carbon heater 3. When the temperature of the heated region exceeds the melting point $T_M$, this region is melted. The molten region is gradually resolidified by spontaneous cooling and recrystallized when the strip heater 3 has moved away. As a result of the recrystallization, the grain size, i.e., the monocrystalline region, in the semiconductor layer 5 is increased.

Although the above-described zone-melting recrystallization method can increase the grain size, i.e., the monocrystalline region, in the semiconductor layer, it still has the following drawbacks.

FIG. 21(a) is a schematic diagram illustrating the state where the semiconductor layer 5 in the semiconductor wafer 1 is zone-melted and recrystallized, and FIG. 21(b) is an enlarged view of a part A in FIG. 21(a). As shown in these figures, in the zone-melting recrystallization process, since a linear (band-shaped) molten region is recrystallized, a lot of crystalline nuclei 5a that serve as seeds for recrystallization are produced as shown in FIG. 21(b), and a lot of grain boundaries 5b are randomly produced in the semiconductor layer obtained through the recrystallization process as shown in FIG. 21(a). The grain boundaries 5b are defects in the crystal structure at the boundaries of adjacent monocrystalline regions having different crystal orientations. Therefore, it is not possible to satisfactorily increase the monocrystalline region 5c, i.e., the grain size, in the semiconductor layer.

Meanwhile, a zone-melting recrystallization method that provides a larger grain size than the grain size provided by the above-described method is proposed. In this method, positions where grain boundaries are produced are controlled.

FIGS. 22(a)–22(b) are diagrams for explaining this zone-melting recrystallization method, wherein FIG. 22(a) is a cross-sectional view illustrating a semiconductor wafer structure used in the method and FIG. 22(b) illustrates a temperature distribution within the wafer. FIG. 23 is a schematic diagram illustrating a crystal structure of a semiconductor layer obtained through the zone-melting recrystallization process. In these figures, reference numeral 1A designates a semiconductor wafer and reference numeral 7 designates stripe-shaped heat insulating films arranged periodically on the insulating film 6 of the semiconductor wafer 1A at a uniform interval. The heat insulating films 7 comprise a semiconductor material. This zone-melting recrystallization method is fundamentally identical to the method already described with respect to FIG. 18 except that the stripe-shaped heat insulating films 7 are disposed on the insulating film 6 of the semiconductor wafer and the strip carbon heater 3 is moved across the semiconductor wafer along the stripe direction of the heat insulating films 7.

In this zone-melting recrystallization method, as shown in FIG. 22(b), the temperature of the semiconductor wafer 1A has a sinusoidal distribution in which portions of the wafer just under the heat insulating films 7 are lower than the other portions. Therefore, according to this method, the liquid-solid interface between the molten portion and the resolidified and recrystallized portion produced in the semiconductor layer 5 during the zone-melting recrystallization periodic, i.e., concave and convex, because of the sinusoidal temperature distribution. As shown in FIG. 23, grain boundaries 5b are concentrated at the concave portions of the liquid-solid interface in the semiconductor layer 5 under the stripe-shaped heat insulating films 7, whereby the monocrystalline region 5c, i.e., grain size, in the semiconductor layer 5 is increased as compared to the prior art method shown in FIG. 18.

In this method, however, since it is necessary to form the stripe-shaped heat insulating films 7 on the insulating film 6 of the semiconductor wafer 1A in advance, the process is complicated as compared to the method shown in FIG. 18, resulting in an increase in cost. Further, although the grain size in the semiconductor layer is certainly increased as compared to the prior art method shown in FIG. 18, since the generation of the grain boundaries cannot be substantially suppressed, the increase of the grain size is not satisfactory.

SUMMARY OF THE INVENTION

An object of the present invention is to provide a method and an apparatus for zone-melting and recrystallizing semiconductor layers that can reduce the generation of grain boundaries and increase the grain size, i.e., the monocrystalline region, as compared to the above-described prior art methods.

Another object of the present invention is to provide a method and an apparatus for zone-melting and recrystallizing semiconductor layers that can increase the grain size, i.e., the monocrystalline region, by controlling the positions where the grain boundaries are produced, without using stripe-shaped heat insulating films on the semiconductor wafer.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a method for zone-melting recrystallization of a semiconductor layer comprises heating a spot region of the semiconductor layer; and spirally moving the heated spot region relatively to the semiconductor layer to melt and recrystallize the semiconductor layer, thereby producing a large-area monocrystalline region in the semiconductor layer. In the initial stage of the zone-melting recrystallization, a single crystalline nucleus is produced in the semiconductor layer, and the entire semiconductor layer is recrystallized with the single crystalline nucleus as a seed crystal. Therefore, the semiconductor layer is recrystallized with the same crystal structure and orientation as those of the single crystalline nucleus, so that the generation of grain boundaries is suppressed, resulting in a semiconductor layer in which the grain size, i.e., monocrystalline region, is increased compared to that obtained by the prior art method.

According to a second aspect of the present invention, in the above-described zone-melting recrystallization method, the heated spot is moved spirally with a center point of the semiconductor layer as a starting point of the spiral move, gradually increasing the distance from the center point. In this method, a single crystalline nucleus is produced in the center of the semiconductor layer, and a recrystallized region having the same crystal structure and orientation as those of the crystalline nucleus spreads with the crystalline nucleus as a seed crystal. As a result, generation of grain boundaries is significantly reduced.

According to a third aspect of the present invention, an apparatus for zone-melting recrystallization of a semiconductor layer includes a first heater, on which a semiconductor wafer comprising the semiconductor layer and upper and lower insulating layers sandwiching the semiconductor layer is mounted, for radiantly heating a rear surface of the semiconductor wafer to a temperature at which the semiconductor layer and the insulating layers are not melted; and a second heater disposed above the semiconductor wafer and radiantly heating a front surface of the semiconductor wafer, the second heater having a heat generating point that produces a heated spot in the semiconductor layer and moves spirally while maintaining a prescribed distance from the semiconductor wafer, thereby producing a large-area monocrystalline region in the semiconductor layer. In the initial stage of the zone-melting recrystallization, a single crystalline nucleus is produced in the semiconductor layer, and the entire semiconductor layer is recrystallized with the single crystalline nucleus as a seed crystal. Therefore, the semiconductor layer is recrystallized with the same crystal structure and orientation as those of the single crystalline nucleus, so that the generation of grain boundaries is suppressed, resulting in a semiconductor layer in which the grain size, i.e., monocrystalline region, is increased compared to that obtained by the prior art method.

According to a fourth aspect of the present invention, a method for zone-melting recrystallization of a semiconductor layer comprises heating a linear region of the semiconductor layer so that alternating high-temperature portions and low-temperature portions are produced in the longitudinal direction of the linear region; and moving the linear heated region in the direction perpendicular to the longitudinal direction of the heated region to melt and recrystallize the semiconductor layer, thereby producing a large-area monocrystalline semiconductor region in the semiconductor layer.

According to a fifth aspect of the present invention, an apparatus for zone-melting recrystallization of a semiconductor layer comprises a first heater, on which a semiconductor wafer including the semiconductor layer and upper and lower insulating layers sandwiching the semiconductor layer is mounted, for radiantly heating a rear surface of the semiconductor wafer to a temperature at which the semiconductor layer and the insulating layers are not melted; and a second heater for radiantly heating a front surface of the semiconductor wafer and moving across the semiconductor wafer at a uniform rate while maintaining a prescribed distance from the semiconductor wafer, the second heater comprising a semiconductor laser array in which a plurality of semiconductor laser chips are arranged in a straight line in the longitudinal direction thereof. The semiconductor laser chips emit laser beams having different intensities that provide a sinusoidal distribution for the surface temperature of the semiconductor wafer heated by the laser beams.

According to a sixth aspect of the present invention, an apparatus for zone-melting recrystallization of a semiconductor layer comprises a first heater on which a semiconductor wafer including the semiconductor layer and upper and lower insulating layers sandwiching the semiconductor layer is mounted, for radiantly heating a rear surface of the semiconductor wafer to a temperature at which the semiconductor layer and the insulating layers are not melted; and a second heater for radiantly heating a front surface of the semiconductor wafer and moving across the semiconductor wafer at a uniform rate while maintaining a prescribed distance from the semiconductor wafer, the second heater comprising a semiconductor laser array in which a plurality of semiconductor laser chips are arranged in a straight line in the longitudinal direction thereof. The semiconductor laser chips emit laser beams in different directions that provide a sinusoidal distribution for the surface temperature of the semiconductor wafer heated by the laser beams.

According to a seventh aspect of the present invention, an apparatus for zone-melting recrystallization of a semiconductor layer comprises a first heater, on which a semiconductor wafer comprising the semiconductor layer and upper and lower insulating films sandwiching the semiconductor layer is mounted, for radiantly heating a rear surface of the semiconductor wafer to a temperature at which the semiconductor layer and the insulating layers are not melted; and a second heater for radiantly heating a front surface of the semiconductor wafer and moving across the semiconductor wafer at a uniform rate while maintaining a prescribed distance from the semiconductor wafer, the second heater comprising a strip carbon heater having a periodic concave-convex variation in the thickness in the longitudinal direction thereof. The variation providing alternating high-temperature regions and low-temperature regions in the semiconductor layer heated by the second heater.

According to an eighth aspect of the present invention, an apparatus for zone-melting recrystallization of a semiconductor layer comprises a first heater, on which a semiconductor wafer comprising the semiconductor layer and upper and lower insulating layers sandwiching the semiconductor layer is mounted, for radiantly heating a rear surface of the semiconductor wafer to a temperature at which the semiconductor layer and the insulating layers are not melted; and a second heater for radiantly heating a front surface of the semiconductor wafer and moving across the semiconductor wafer at a uniform rate while maintaining a prescribed distance from the semiconductor wafer, the second heater comprising a strip carbon heater that includes a plurality of island regions each having a prescribed length and arranged at prescribed intervals in the longitudinal direction of the heater and that has a periodic concave-convex variation in the caloric power in the longitudinal direction of the heater. The variation is produced by a first current flowing through the heater in the longitudinal direction and second currents flowing between adjacent two of the island regions, and the variation provide alternating high-temperature regions and low-temperature regions in the semiconductor layer heated by the second heater.

According to a ninth aspect of the present invention, an apparatus for zone-melting recrystallization of a semiconductor layer comprises a first heater, on which a semiconductor wafer comprising the semiconductor layer and upper and lower insulating layers sandwiching the semiconductor layer is mounted, for radiantly heating a rear surface of the semiconductor wafer to a temperature at which the semiconductor layer and the insulating layers are not melted; and a second heater for radiantly heating a front surface of the semiconductor wafer and moving across the semiconductor wafer at a uniform rate while maintaining a prescribed distance from the semiconductor wafer, the second heater comprising a strip carbon heater having a longitudinal surface and a plurality of heat insulating members arranged on the longitudinal surface of the strip carbon heater at prescribed intervals. The heat insulating members provide alternating high-temperature regions and low-temperature regions in the semiconductor layer heated by the second heater.

In the above-described fourth to ninth aspects of the present invention, the linear molten region produced in the semiconductor layer has a temperature distribution corresponding to the temperature distribution of the heated region, and the liquid-solid interface between the molten region and the solidified, i.e., recrystallized, region produced during the recrystallization of the semiconductor layer has an alternating concave-convex pattern corresponding to the shape of the temperature distribution. Therefore, the semiconductor layer can be recrystallized while controlling the positions where the grain boundaries are produced, without using the stripe-shaped heat insulating films on the insulating film of the semiconductor wafer which are used in the prior art method and apparatus. As a result, the process required for the zone-melting recrystallization of the semiconductor layer is simplified and the cost is reduced.

According to a tenth aspect of the present invention, a method for zone-melting recrystallization of a semiconductor layer comprises heating a linear region of the semiconductor layer, the region having a longitudinal side of zigzag or sinusoidal form; and moving the linear heated region in the direction perpendicular to the longitudinal direction of the heated region so that the zigzag or sinusoidal side of that region is on the rear side of the moving direction to melt and recrystallize the semiconductor layer, thereby producing a large-area monocrystalline region in the semiconductor layer.

According to an eleventh aspect of the present invention, an apparatus for zone-melting recrystallization of a semiconductor layer includes a first heater, on which a semiconductor wafer including the semiconductor layer and upper and lower insulating layers sandwiching the semiconductor layer is mounted, for radiantly heating a rear surface of the semiconductor wafer to a temperature at which the semiconductor layer and the insulating layers are not melted; and a second heater for radiantly heating a front surface of the semiconductor wafer and moving across the semiconductor wafer at a uniform rate while maintaining a prescribed distance from the semiconductor wafer, the second heater comprising a strip carbon heater having a longitudinal surface with a zigzag or sinusoidal pattern.

In the above-described tenth and eleventh aspects of the invention, the linear molten region produced in the semiconductor layer corresponds to the linear heated region having a longitudinal side of zigzag or sinusoidal form, and a side of the linear molten region on the rear side of the moving direction is of a zigzag or sinusoidal form. Therefore, the liquid-solid interface between the molten region and the solidified, i.e., recrystallized, region produced during the recrystallization of the semiconductor layer has an alternating concave-convex pattern corresponding to the zigzag or sinusoidal side of the linear molten region, so that the semiconductor layer is recrystallized while controlling the positions where grain boundaries are produced, without using stripe-shaped heat insulating films on the insulating film of the semiconductor wafer which are used in the prior art method and apparatus. As a result, the process required for the zone-melting recrystallization of the semiconductor layer is simplified, and the cost is reduced.

According to a twelfth aspect of the present invention, a method for zone-melting recrystallization of a semiconductor layer comprises heating a linear region of the semiconductor layer, the linear region winding in zigzag or sinusoidal form; and moving the linear heated region in the direction perpendicular to the longitudinal direction of the heated region to melt and recrystallize the semiconductor layer, thereby producing a large-area monocrystalline region in the semiconductor layer.

According to a thirteenth aspect of the present invention, an apparatus for zone-melting recrystallization of a semiconductor layer includes a first heater, on which a semiconductor wafer comprising the semiconductor layer and upper and lower insulating layers sandwiching the semiconductor layer is mounted, for radiantly heating a rear surface of the semiconductor wafer to a temperature at which the semiconductor layer and the insulating layers are not melted; and a second heater for radiantly heating a front surface of the semiconductor wafer and moving across the semiconductor wafer at a uniform rate while maintaining a prescribed distance from the semiconductor wafer, the second heater comprising a semiconductor laser array in which a plurality of semiconductor chips are arranged in a zigzag or sinusoidal line.

In the above-described twelfth and thirteenth aspects of the present invention, the linear molten region produced in the semiconductor layer corresponds to the linear heated region winding in zigzag or sinusoidal form, and this molten region has a zigzag or sinusoidally winding form. Therefore, the liquid-solid interface between the molten region and the solidified, i.e., recrystallized, region produced during the recrystallization of the semiconductor layer has an alternating concave-convex pattern corresponding to the zigzag or sinusoidal form. Therefore, the semiconductor layer is recrystallized while controlling the positions where grain boundaries are produced, without using stripe-shaped heat insulating films on the insulating film of the semiconductor wafer which are used in the prior art method and apparatus. As a result, the process required for the zone-melting recrystallization of the semiconductor layer is simplified, and the cost is reduced.

According to a fourteenth aspect of the present invention, a method for zone-melting recrystallization of a semiconductor layer comprises heating a spot or a linear region of the semiconductor layer, the linear region having such a short length that a melted and recrystallize region created in the semiconductor layer with the move of the heated region is a narrow region recrystallized with a single crystalline nucleus as a seed crystal; and horizontally rotating the semiconductor layer with a center point thereof as an axis of the rotation so that the heated region is moved from center point of the horizontally rotating semiconductor layer toward the periphery of the semiconductor layer to melt and recrystallize the semiconductor layer, thereby producing a large-area monocrystalline region in the semiconductor layer.

According to a fifteenth aspect of the present invention, an apparatus for zone-melting recrystallization of a semiconductor layer includes a first heater, on which a semiconductor wafer comprising the semiconductor layer and upper and lower insulating layers sandwiching the semiconductor layer is mounted, for radiantly heating a rear surface of the semiconductor wafer to a temperature at which the semiconductor layer and the insulating layers are not melted, the first heater horizontally rotating to horizontally rotate the semiconductor wafer; and a second heater for radiantly heating a front surface of the semiconductor wafer, the second heater having a heat generating point or a heat generating linear portion that produces a heated spot in the semiconductor layer and moves from a center point of the horizontally rotating semiconductor layer toward the periphery of the semiconductor layer at a uniform rate while maintaining a prescribed distance from the semiconductor wafer, thereby producing a large-area monocrystalline region in the semiconductor layer.

In the above-described fourteenth and fifteenth aspects of the invention, with the move of the heated spot or the heated short linear region, a single crystalline nucleus is produced in the center of the semiconductor layer, and the entire semiconductor layer is recrystallized with the single crystalline nucleus as a seed crystal. Therefore, the semiconductor layer is recrystallized with the same crystal structure and orientation as those of the single crystalline nucleus, so that grain boundaries are reduced, resulting in a semiconductor layer in which the grain size, i.e., monocrystalline region, is increased compared to that obtained by the prior art method.

DETAILED DESCRIPTION OF THE PREFERRED EMBODIMENTS

[Embodiment 1]

Figure 1:
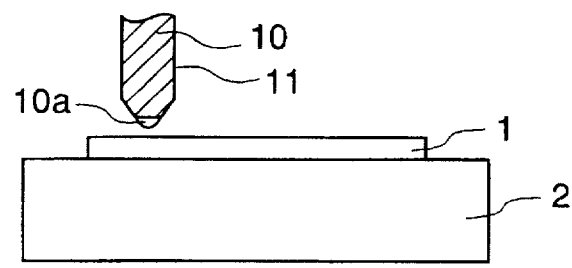
FIG. 1 is a side view illustrating an apparatus for zone-melting recrystallization of a semiconductor layer in accordance with a first embodiment of the present invention.

FIG. 1 is a side view illustrating an apparatus for zone-melting recrystallization of a semiconductor layer in accordance with a first embodiment of the present invention. In the figure, the same reference numerals as in FIG. 18 designate the same or corresponding parts. Reference numeral 10 designates a heater which is positioned above the semiconductor wafer 1 at a prescribed distance. The heater 10 comprises a carbon heater shaped like a pen and coated with a heat radiation suppressing film 11 except at a tip 10a from which heat is radiated. The heat radiation suppressing film 11 comprises an insulating heat-resistant material, such as boron nitride (BN). The heater 10 is moved by a drive mechanism (not shown) so that the tip 10a describes a spiral from a central point of the wafer, gradually increasing in radius during the spiral movement, while maintaining the distance from the surface of the wafer 1. The tip 10a of the heater 10 is a truncated cone or a truncated pyramid in shape with a diameter or a width less than 1 mm. As shown in FIG. 19, the semiconductor wafer 1 comprises a silicon substrate 4 on which a single insulating film selected from a silicon nitride film, a silicon oxynitride film, an aluminum oxide film, and an aluminum nitride film or a laminated structure comprising at least two of the above-described films is formed, a semiconductor layer 5 disposed on the silicon substrate 4 and comprising polycrystalline silicon or amorphous silicon, and an insulating film 6 disposed on the semiconductor layer 5 and comprising a single film selected from a silicon oxide film, a silicon nitride film, a silicon oxynitride film, an aluminum oxide film, and an aluminum nitride film or a laminated structure comprising at least two of the above-described films.

A description is given of the operation.

Figure 2:
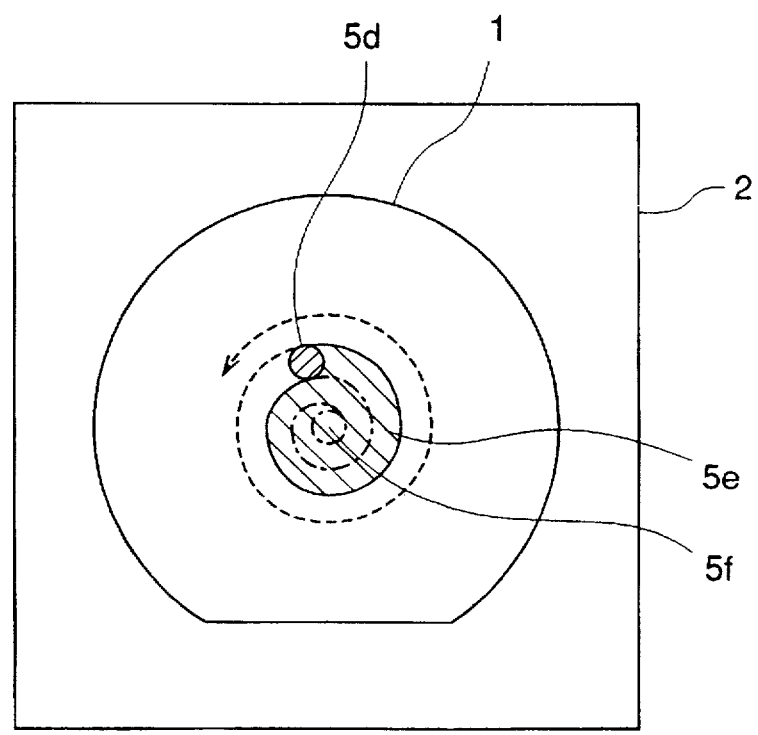
FIG. 2 is a schematic diagram for explaining the operation of the apparatus shown in FIG. 1 and the state where the semiconductor layer is zone-melted and recrystallized.

The semiconductor wafer 1 is mounted on the upper surface of the plate carbon heater 2. The semiconductor wafer 1 is heated at the rear surface by the heater 2 to a temperature at which the semiconductor layer 5 and the insulating film 6 are not melted. In this state, the tip 10a, i.e., heat radiating spot, of the heater 10 is positioned above the central point of the semiconductor wafer 1 and moved at a uniform rate so that the tip 10a describes a spiral from the central point of the wafer 1, gradually increasing in radius during the spiral movement, while maintaining the distance from the surface of the wafer 1, whereby the semiconductor layer 5 is melted and recrystallized without leaving unmelted portions in the semiconductor layer 5. The spiral zone-melting recrystallization of the semiconductor layer 5 in the wafer 1 using the heater 10 is schematically shown in FIG. 2. In the figure, reference numeral 5d designates a molten region (molten spot) of the semiconductor layer 5 just under the tip 10a of the heater 10, reference numeral 5e designates a monocrystalline region of the semiconductor layer 5 where the molten region 5d is resolidified and recrystallized after the heater 10 has passed, and reference numeral 5f designates a center region of the semiconductor layer 5 from which the zone-melting recrystallization has started. The alternate long and short dashed line shows the trace of the melted and recrystallized region 5e, and the dotted line shows the course in which the molten region 5d moves. In this first embodiment of the invention, the tip 10a of the heater 10 is moved so that the molten region 5d produced by the heat emitted from the tip 10a of the heater 10 overlaps the peripheral portion of the melted and recrystallized region 5e.

In the above-described method, initially, the narrow region 5f in the center of the semiconductor layer 5 is melted by the heat from the tip 10a of the heater 10 and recrystallized. This region is recrystallized with a single crystalline nucleus as a seed crystal. With the movement of the tip 10a of the heater 10, unmelted regions in the semiconductor layer 5 are successively melted and recrystallized simultaneously along the peripheral portion of the recrystallized region 5e. Therefore, the gradually increasing molten and recrystallized region 5e inherits the crystal structure and orientation of the narrow center region 5f that is initially melted and recrystallized with a single crystalline nucleus as a seed crystal (to be exact, the crystal structure and orientation of the single crystalline nucleus), so that the recrystallized region 5e has the same crystal structure and orientation as those of the narrow center region 5f. Therefore, generation of grain boundaries is significantly reduced, resulting in a semiconductor layer with increased grain size, i.e., increased monocrystalline region, as compared with that provided by the prior art method.

In the above-described first embodiment of the invention, as shown in FIG. 2, the initial position of the zone-melting recrystallization is in the center of the semiconductor layer 5, and the tip 10a of the heater 10 is spirally moved from the center point of the semiconductor layer 5 so that the radius of the spiral path is gradually increased. However, the initial position may be located opposite the periphery of the semiconductor wafer 1 and the tip 10a of the heater 10 may be moved spirally from the initial position toward the center of the wafer 1 so that the radius of the spiral path is gradually reduced. Also in this case, a semiconductor layer with increased grain size, i.e., increased monocrystalline region, is produced. In this case, however, since a plurality of crystalline nuclei are produced while the tip 108 of the heater 10 moves along the periphery of semiconductor wafer 1, a few more grain boundaries are produced as compared to the method described with respect to FIG. 2.

Although in the above-described first embodiment the heater 10 is moved, the heater 10 may be fixed and the plate carbon heater 2 may be horizontally rotated so that the tip 10a of the heater 10 describes a spiral with respect to the semiconductor wafer 1. Also in this case, the same effects as described above are obtained.

While in the above-described first embodiment a pen-shaped carbon heater coated with a heat radiation suppressing film, expect at a tip portion is employed as the heater 10, other heaters, such as a semiconductor laser, a halogen lamp, and an IR (infrared ray) lamp, may be employed.

[Embodiment 2]

Figure 3:
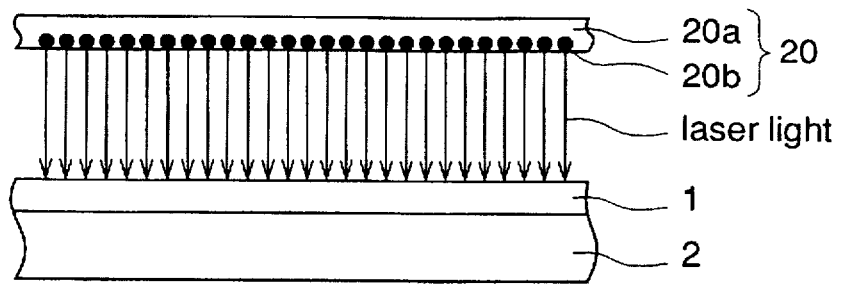
FIG. 3 is a side view of an apparatus for zone-melting recrystallization of a semiconductor layer in accordance with a second embodiment of the present invention.
Figure 4:
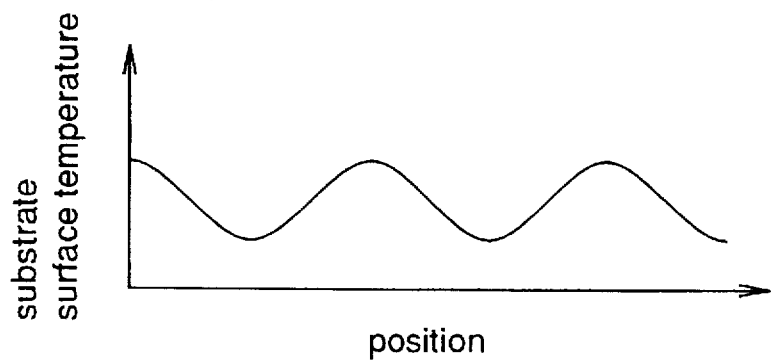
FIG. 4 is a diagram illustrating a distribution of a surface temperature of the semiconductor layer heated by the apparatus shown in FIG. 3.

FIG. 3 is a schematic diagram illustrating an apparatus for zone-melting recrystallization of a semiconductor layer in accordance with a second embodiment of the present invention. In the figure, the same reference numerals as in FIG. 18 designate the same or corresponding parts. Reference numeral 20 designates a laser array comprising a strip substrate 20a and a plurality of semiconductor laser chips 20b arranged in an array on a prescribed longitudinal surface of the strip substrate 20a in the longitudinal direction of the substrate. The semiconductor wafer 1 is similar to the semiconductor wafer used in the first embodiment. FIG. 4 shows the surface temperature of the semiconductor wafer 1 heated in the method according to this second embodiment.

Figure 18:
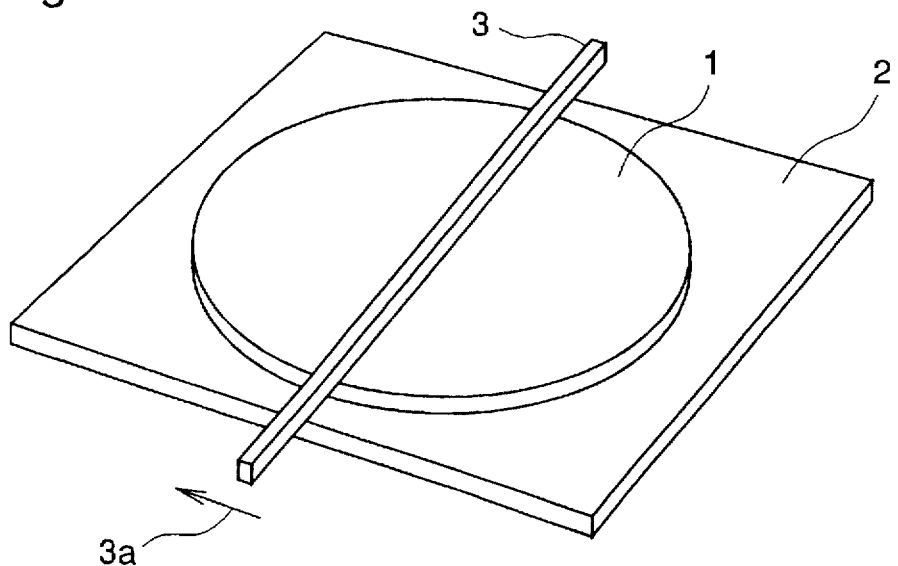
FIG. 18 is a perspective view illustrating an apparatus for zone-melting recrystallization of a semiconductor layer according to the prior art.
Figure 19:
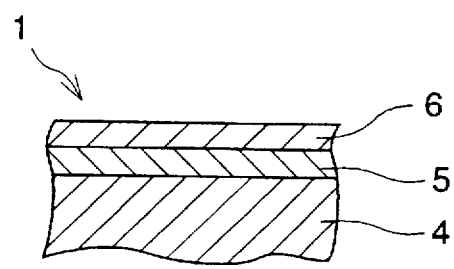
FIG. 19 is a sectional view illustrating a structure of a semiconductor wafer employed in the prior art and the present invention.
Figure 20:
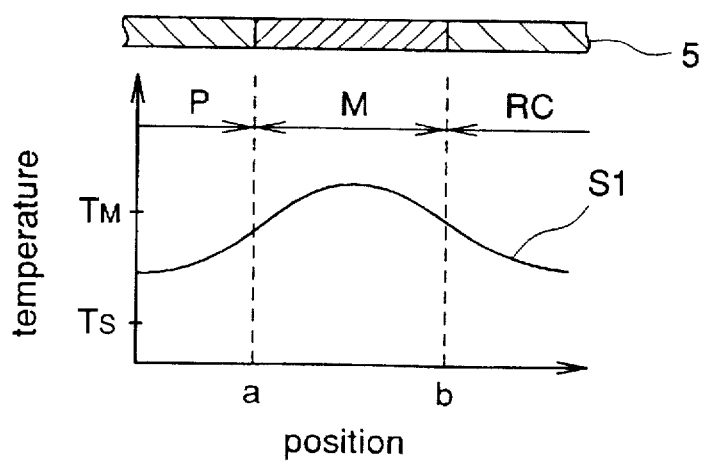
FIG. 20 is a diagram for explaining a mechanism of zone-melting recrystallization of a semiconductor layer according to the prior art.

The zone-melting recrystallization method according to this second embodiment is fundamentally identical to the prior art method shown in FIG. 18 except that the semiconductor laser array 20 is used in place of the strip carbon heater 3 and the semiconductor laser array 20 is positioned above the semiconductor wafer 1 and moved across the semiconductor wafer at a uniform rate. The semiconductor laser chips 20b emit laser beams in the same direction, but the laser beams have different intensities that provide a sinusoidal distribution of the surface temperature of the semiconductor wafer 1 heated by the laser beams, as shown in FIG. 4.

Figure 22:
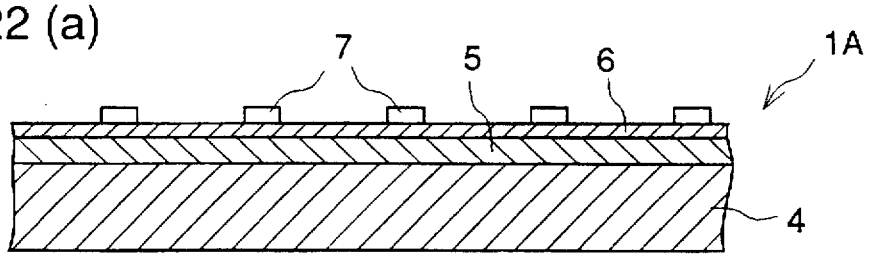
FIG. 22(a) is a side view illustrating an apparatus for zone-melting recrystallization of a semiconductor layer according to the prior art.
FIG. 22(b) is a diagram illustrating a temperature distribution inside a semiconductor wafer heated by the apparatus.
Figure 22:
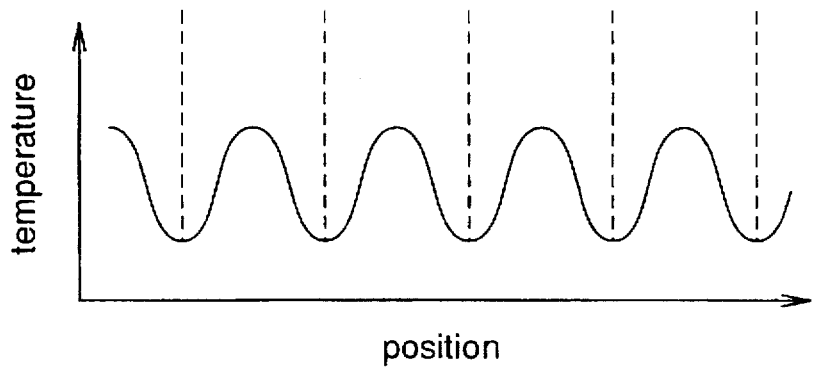
Figure 23:
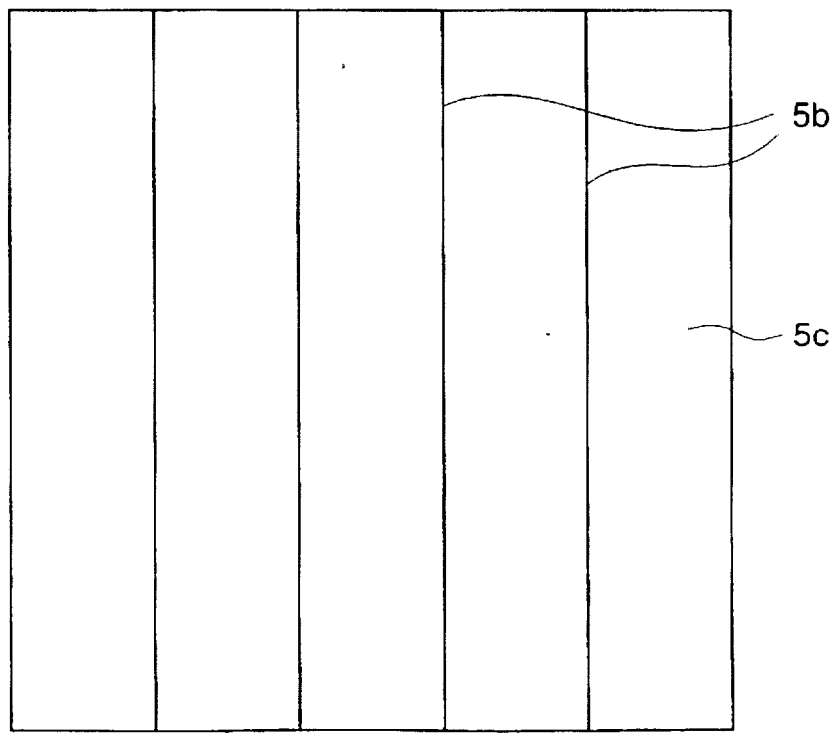
FIG. 23 is a schematic diagram illustrating the crystal state of the semiconductor layer which is zone-melted and recrystallized by the apparatus shown in FIG. 22(a).

In this second embodiment of the present invention, as in the prior art method shown in FIGS. 22(a)–22(b), the temperature of the semiconductor layer 5 in the semiconductor wafer 1 has a sinusoidal distribution as shown in FIG. 22(b), and the liquid-solid interface between the molten region and the resolidified and recrystallized region produced in the semiconductor layer 5 during the zone-melting recrystallization process has a sinusoidal form, i.e., a periodic concave-convex form, corresponding to the sinusoidal temperature distribution in the semiconductor layer 5. Therefore, grain boundaries are concentrated at the concave portions of the sinusoidal liquid-solid interface, whereby the monocrystalline region, i.e., the grain size, in the semiconductor layer 5 is increased as compared to that obtained by the prior art method shown in FIG. 18. In comparison with the prior art method shown in FIG. 22(a), the stripe-shaped heat insulating films on the semiconductor wafer 1 used in the prior art method are dispensed with. Therefore, the process steps required for the zone-melting recrystallization of the semiconductor layer are reduced as compared to the prior art method shown in FIG. 22(a), whereby the cost is significantly reduced.

[Embodiment 3]

Figure 5:
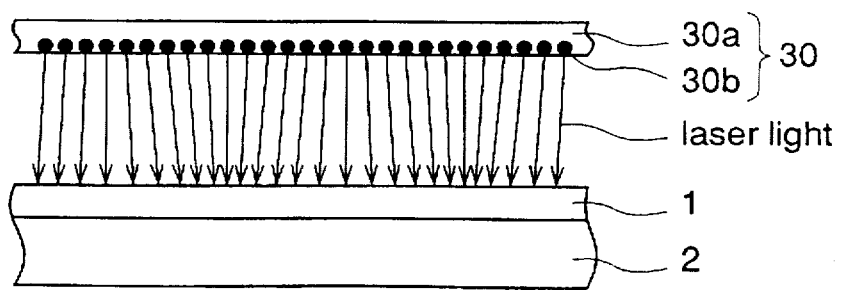
FIG. 5 is a side view illustrating an apparatus for zone-melting recrystallization of a semiconductor layer in accordance with a third embodiment of the present invention.

FIG. 5 is a schematic diagram illustrating an apparatus for zone-melting recrystallization of a semiconductor layer in accordance with a third embodiment of the present invention. In the figure, the same reference numerals as in FIG. 18 designate the same or corresponding parts. Reference numeral 30 designates a laser array comprising a strip substrate 30a and a plurality of semiconductor laser chips 30b arranged in an array on a prescribed surface of the strip substrate 30a in the longitudinal direction of the substrate. The semiconductor wafer 1 is similar to the semiconductor wafer used in the first embodiment.

Figure 6:
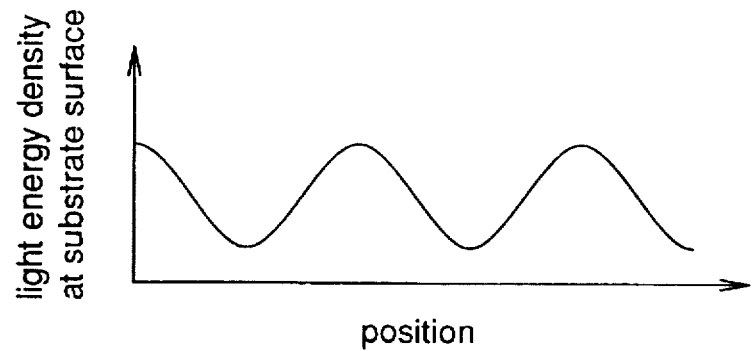
FIG. 6(a) is a diagram illustrating a distribution of light energy density of laser light at the surface of the semiconductor wafer heated by the apparatus shown in FIG. 4.
FIG. 6(b) is a diagram illustrating a distribution of the surface temperature.
Figure 6:
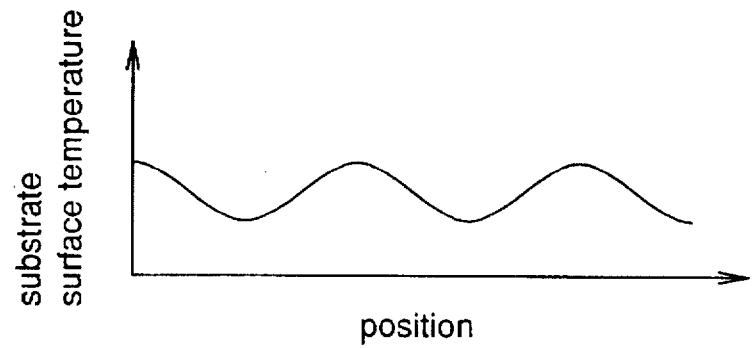

FIG. 6(a) shows the energy density of laser light at the surface of the semiconductor wafer 1 heated in the method according to this third embodiment, and FIG. 6(b) shows the surface temperature of the semiconductor wafer 1.

The zone-melting recrystallization method according to this third embodiment is fundamentally identical to the prior art method shown in FIG. 18 except that the semiconductor laser array 30 is used in place of the strip carbon heater 3 and the semiconductor laser array 30 is positioned above the semiconductor wafer 1 and moved across the semiconductor wafer at a uniform rate. The semiconductor laser chips 30b emit laser beams of the same intensity, but these laser chips 30b are arranged on the strip substrate 30a so that the laser beams are emitted in different directions which provide a sinusoidal distribution of the light energy density at the wafer surface shown in FIG. 6(a). Thereby, the surface temperature of the semiconductor wafer 1 has the sinusoidal distribution shown in FIG. 6(b) corresponding to the sinusoidal distribution of light energy density shown in FIG. 6(a).

Also in this third embodiment, as in the prior art method shown in FIGS. 22(a)–22(b), the temperature of the semiconductor layer 5 in the semiconductor wafer 1 has the sinusoidal distribution shown in FIG. 22(b), whereby the same effects as provided by the above-described second embodiment are obtained.

In this third embodiment of the invention, a semiconductor laser array in which a plurality of laser chips are arranged on a strip substrate so that the laser chips emit laser beams in different directions is employed. However, when a semiconductor laser array in which a plurality of laser chips are arranged so that laser beams emitted from the laser chips are in the same direction is employed and the surface of the semiconductor wafer is irradiated with the laser beams which are reflected by a mirror having alternating concave and convex portions to make the sinusoidal distribution of the light energy density shown in FIG. 6(a), the same effects as described above are achieved.

[Embodiment 4]

Figure 7:
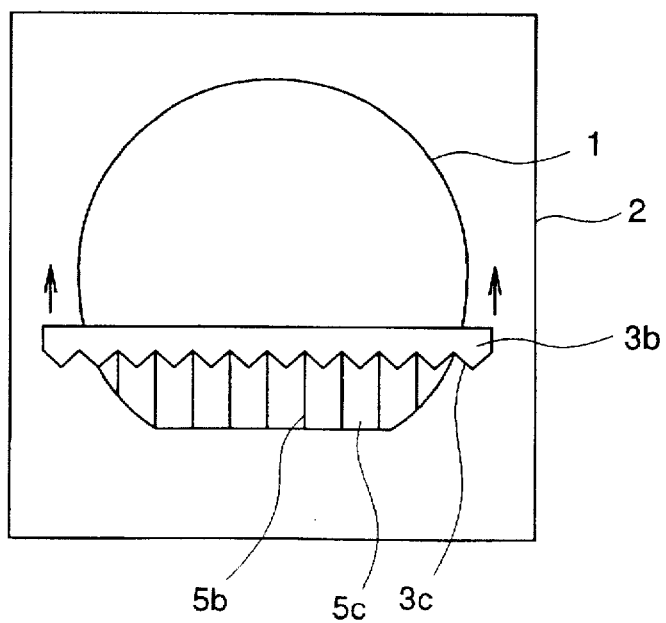
FIG. 7 is a plan view illustrating an apparatus for zone-melting recrystallization of a semiconductor layer in accordance with a fourth embodiment of the present invention.
Figure 21:
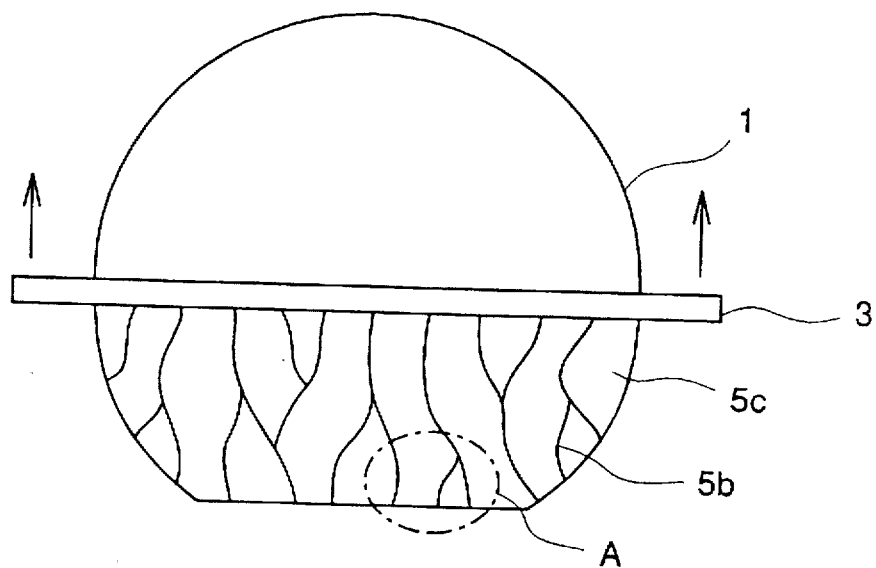
FIG. 21(a) is a schematic diagram illustrating the state where a semiconductor layer is zone-melted and recrystallized in the prior art zone-melting recrystallization method.
FIG. 21(b) is an enlarged view of a part of the semiconductor layer.
Figure 21:
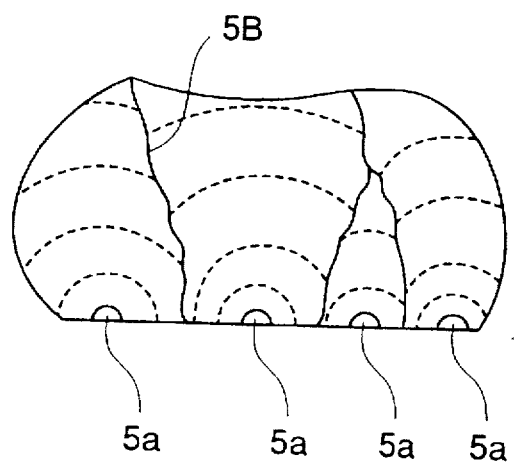

FIG. 7 is a schematic diagram illustrating an apparatus for zone-melting recrystallization of a semiconductor layer in accordance with a fourth embodiment of the present invention. In the figure, the same reference numerals as in FIGS. 18 and 21(a) designate the same or corresponding parts. Reference numeral 3b designates a strip carbon heater having a zigzag pattern of periodic V-shaped grooves 3c at a longitudinal surface. The strip carbon heater 3b is moved across the semiconductor wafer 1 in the direction indicated by arrows. FIG. 7 shows, besides the structure of the apparatus, the state where the semiconductor layer 5 in the semiconductor wafer 1 is zone-melted and recrystallized.

The zone-melting recrystallization method according to this fourth embodiment of the invention is fundamentally identical to the prior art method shown in FIG. 18 except that the strip carbon heater 3b has a zigzag pattern of periodic V-shaped grooves 3c at a longitudinal surface and is employed in place of the strip carbon heater 3. The strip carbon heater 3b is moved across the semiconductor wafer 1 at a uniform rate so that the longitudinal surface with the zigzag pattern is on the rear side in the moving direction of the heater 3b.

In this method, an edge of a linear molten region in the semiconductor layer 5 just under the rear side of the strip carbon heater 3b in the moving direction has a zigzag shape corresponding to the zigzag pattern of the heater 3b, and this molten region is cooled and resolidified from concave portions of the zigzag edge and, thereafter, convex portions of the zigzag edge are cooled and resolidified. Thereafter, the liquid-solid interface between the molten region and the resolidified and recrystallized region produced in the semiconductor layer 5 during the zone-melting recrystallization has a zigzag shape corresponding to the zigzag pattern on the longitudinal surface of the strip carbon heater 3b. As shown in FIG. 7, grain boundaries 5b produced in the semiconductor layer 5 are concentrated at portions opposite the concave portions of the zigzag pattern of the strip carbon heater 3b, whereby the monocrystalline region 5c in the semiconductor layer 5 is increased as compared to that obtained by the prior art zone-melting recrystallization method shown in FIG. 18. In comparison with the prior art method shown in FIG. 22(a), the stripe-shaped heat insulating films on the semiconductor wafer 1 used in the prior art method are dispensed with. Therefore, the process steps required for the zone-melting recrystallization are reduced as compared to the prior art method, whereby cost is significantly reduced.

While in this fourth embodiment a zigzag pattern is present on a longitudinal surface of the strip carbon heater 3b, the same effects as described above are obtained when a sinusoidal pattern is present.

[Embodiment 5]

Figure 8:
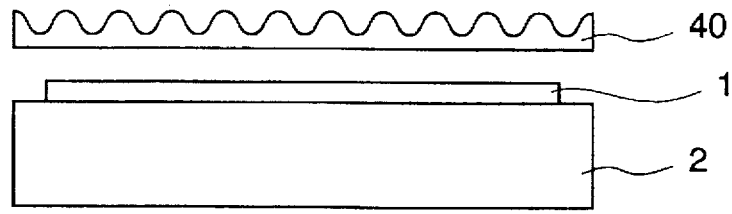
FIG. 8 is a side view illustrating an apparatus for zone-melting recrystallization of a semiconductor layer in accordance with a fifth embodiment of the present invention.
Figure 9:
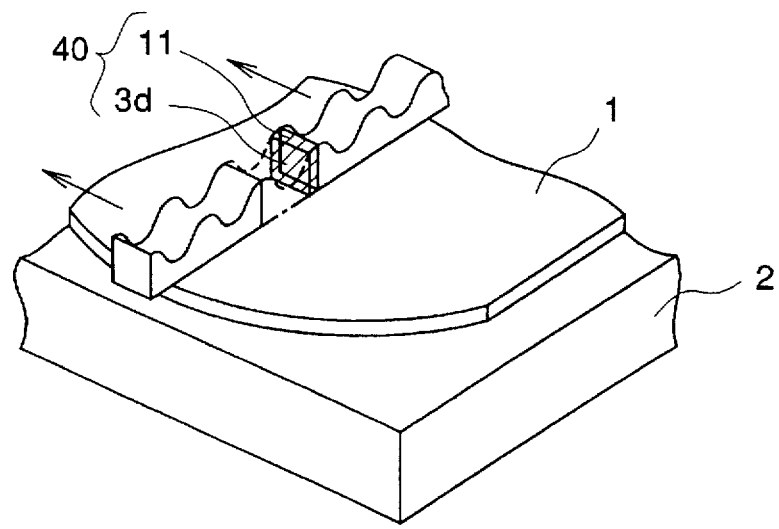
FIG. 9 is a perspective view of a part of the apparatus shown in FIG. 8.

FIGS. 8 and 9 are diagrams illustrating an apparatus for zone-melting recrystallization of a semiconductor layer in accordance with a fifth embodiment of the present invention. More specifically, FIG. 8 is a side view of the apparatus, and FIG. 9 is a perspective view of a part of the apparatus for explaining a strip heater in detail. In these figures, the same reference numerals as in FIG. 18 designate the same or corresponding parts. Reference numeral 40 designates a strip heater comprising a strip carbon heater 3d having a thickness that varies sinusoidally in the longitudinal direction and a heat radiation suppressing film 11 coating the strip carbon heater 3d except a surface confronting the semiconductor wafer 1. In FIG. 9, the strip heater 40 is moved across the semiconductor wafer 1 in the direction shown by arrows.

Figure 10:
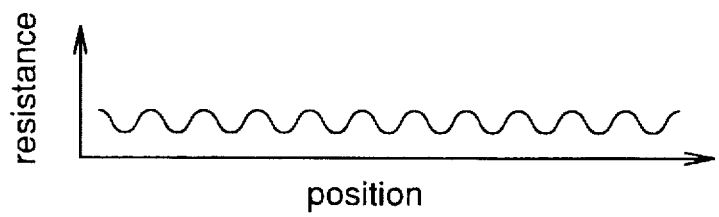
FIG. 10(a) is a diagram illustrating a distribution of resistance in the longitudinal direction of a linear carbon heater in the apparatus shown in FIG. 8.
FIG. 10(b) is a diagram illustrating a distribution in the caloric power of the heater in the longitudinal direction.
Figure 10:
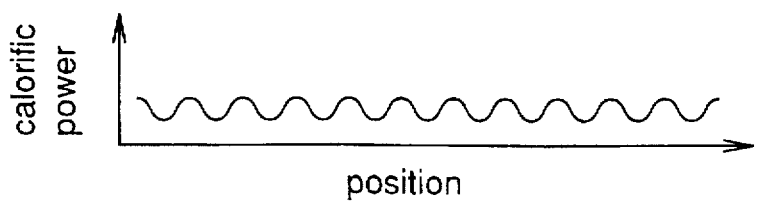

The zone-melting recrystallization method according to this fifth embodiment is fundamentally identical to the prior art method shown in FIG. 18 except that the strip heater 40 shown in FIG. 9 is used in place of the strip carbon heater 3 and the strip heater 40 is positioned above the semiconductor wafer 1 and moved across the semiconductor wafer 1 at a uniform rate. Since the strip carbon heater 3d of the heater 40 has a sinusoidal thickness distribution in the longitudinal direction, the resistance in the longitudinal direction has a distribution (FIG. 10(a)) in inverse proportion to the thickness distribution, and the caloric power in the longitudinal direction has a distribution (FIG. 10(b)) in proportion to the resistance distribution. Therefore, the surface temperature of the semiconductor wafer 1 heated by the strip carbon heater 3d has a sinusoidal distribution similar to that shown in FIG. 4.

In this zone-melting recrystallization method, like the prior art method shown in FIG. 22(a), the temperature of the semiconductor layer 5 included in the semiconductor wafer 1 has a sinusoidal distribution as shown in FIG. 22(b), and the liquid-solid interface between the molten region and the resolidified and recrystallized region produced in the semiconductor layer 5 during the zone-melting recrystallization process has a sinusoidal form, i.e., a periodic concave-convex form, corresponding to the sinusoidal temperature distribution. Therefore, grain boundaries are concentrated at the concave portions of the sinusoidal liquid-solid interface, whereby the monocrystalline region, i.e., the grain size, in the semiconductor layer 5 is increased as compared to that obtained by the prior art method shown in FIG. 18. In comparison with the prior art method shown in FIG. 22(a), the stripe-shaped heat insulating films on the semiconductor wafer 1 are dispensed with. Therefore, the process steps required for the zone-melting recrystallization are reduced as compared to the prior art method, whereby cost is significantly reduced.

[Embodiment 6]

Figure 11:
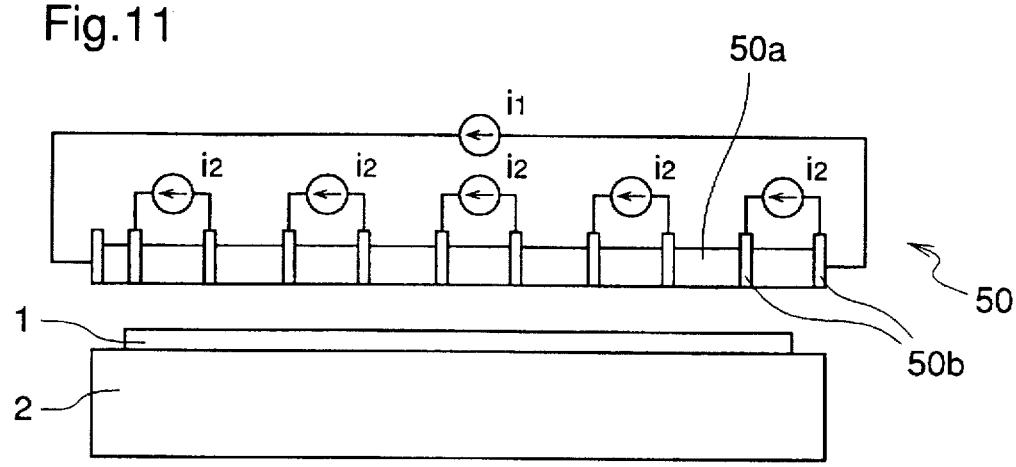
FIG. 11 is a side view illustrating an apparatus for zone-melting recrystallization of a semiconductor layer in accordance with a sixth embodiment of the present invention.

FIG. 11 is a schematic diagram illustrating an apparatus for zone-melting recrystallization of a semiconductor layer in accordance with a sixth embodiment of the present invention. In the figure, the same reference numerals as in FIG. 18 designate the same or corresponding parts. Reference numeral 50 designates a strip heater comprising block carbon heaters 50a and electrode chips 50b which are alternatingly connected using a conductive adhesive (not shown).

Figure 12:
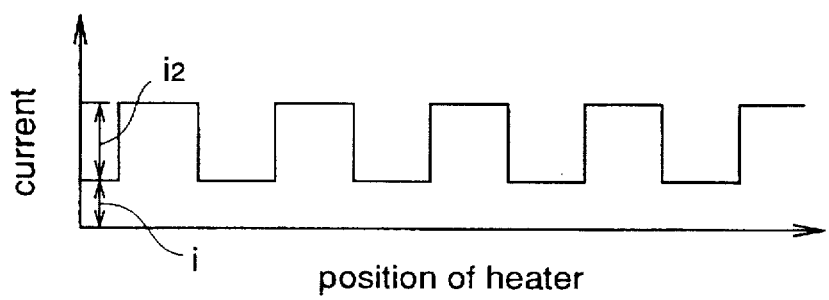
FIG. 12(a) is a diagram illustrating a distribution of current flowing in the longitudinal direction of a linear carbon heater in the apparatus shown in FIG. 11.
FIG. 12(b) is a diagram illustrating a distribution of the caloric power of the heater in the longitudinal direction.
Figure 12:
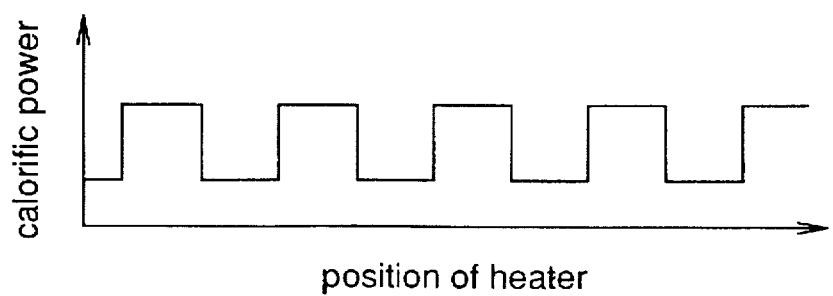

The zone-melting recrystallization method according to this sixth embodiment is fundamentally identical to the prior art method shown in FIG. 18 except that the strip heater 50 shown in FIG. 11 is used in place of the strip carbon heater 3 and the strip heater 50 is positioned above the semiconductor wafer 1 and moved across the semiconductor wafer 1 at a uniform rate. In the strip carbon heater 50, when a first current $i_1$ is applied across the electrodes 50b at the opposite ends of the heater 50 and a second current $i_2$ is applied between pairs of adjacent electrodes 50b, a current distribution of a square-wave form shown in FIG. 12(a) is produced in the longitudinal direction of the heater 50, and the heater 50 generates heat having a caloric power distribution in the square-wave form shown in FIG. 12(b) in the longitudinal direction.

Also in this sixth embodiment of the invention, the semiconductor wafer 1 is heated by the heater 50 so that the surface temperature of the wafer has a sinusoidal distribution similar to that shown in FIG. 4, and the temperature of the semiconductor layer 5 in the semiconductor wafer 1 has the sinusoidal distribution shown in FIG. 22(b). Therefore, the same effects as described in the second embodiment are achieved.

[Embodiment 7]

Figure 13:
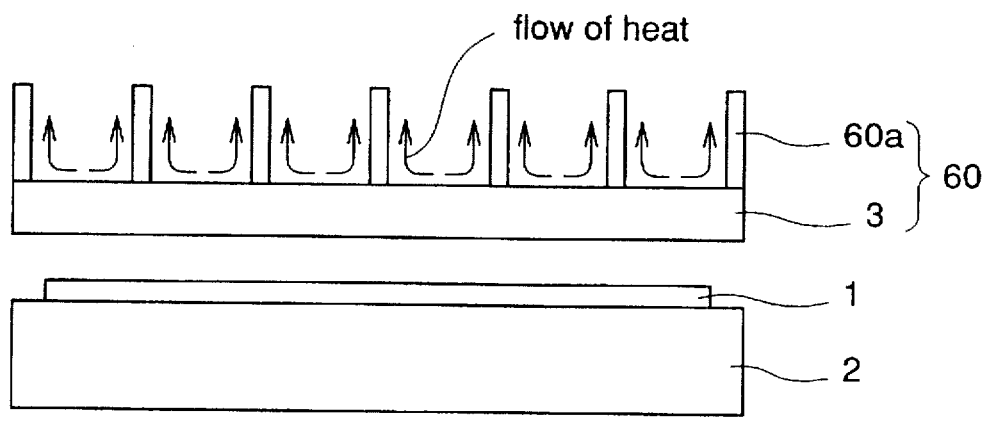
FIG. 13 is a side view illustrating an apparatus for zone-melting recrystallization of a semiconductor layer in accordance with a seventh embodiment of the present invention.

FIG. 13 is a schematic diagram illustrating an apparatus for zone-melting recrystallization of a semiconductor layer in accordance with a seventh embodiment of the present invention. In the figure, the same reference numerals as in FIG. 18 designate the same or corresponding parts. Reference numeral 60 designates a strip heater comprising a strip carbon heater 3 and a plurality of heat radiating pillars 60a which are disposed on and are transverse to the upper surface of the heater 3 at a uniform interval. The heat radiating pillars 60a comprise a metal having a high heat conductivity, such as copper or iron.

The zone-melting recrystallization method according to this fifth embodiment is fundamentally identical to the prior art method shown in FIG. 18 except that the strip heater 60 shown in FIG. 13 is used in place of the strip carbon heater 3 and the strip heater 60 is positioned above the semiconductor wafer 1 and moved across the semiconductor wafer 1 at a uniform rate. In the strip heater 60, when the carbon heater 3 generates heat, the heat generated in the vicinity of the heat radiating pillars 60a is radiated through the pillars 60a, and the temperature of the strip carbon heater 3 has a distribution like a chain of ridges as shown in FIG. 14.

15

Figure 14:
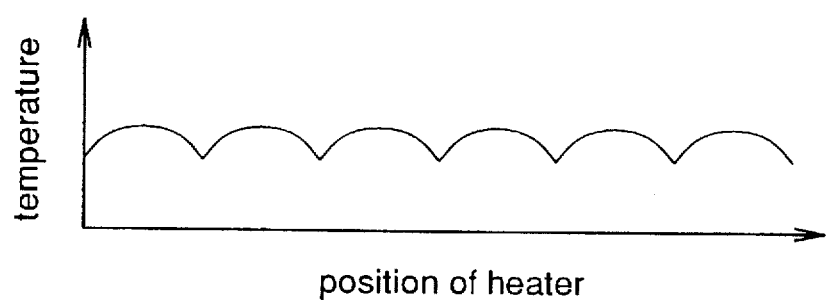
FIG. 14 is a diagram illustrating a distribution of temperature in the longitudinal direction of a linear carbon heater in the apparatus shown in FIG. 13.

In this seventh embodiment of the invention, the surface temperature of the semiconductor wafer 1 has a distribution similar to the distribution shown in FIG. 14, and the temperature of the semiconductor layer 5 in the semiconductor wafer 1 also has a distribution similar to that shown in FIG. 14. Therefore, the liquid-solid interface between the molten region and the solidified and recrystallized region produced in the semiconductor layer 5 during the zone-melting recrystallization has a periodic concave-convex form corresponding to the temperature distribution, and grain boundaries are concentrated at the concave portions of the liquid-solid interface, whereby the same effects as described in the second embodiment are achieved.

[Embodiment 8]

Figure 15:
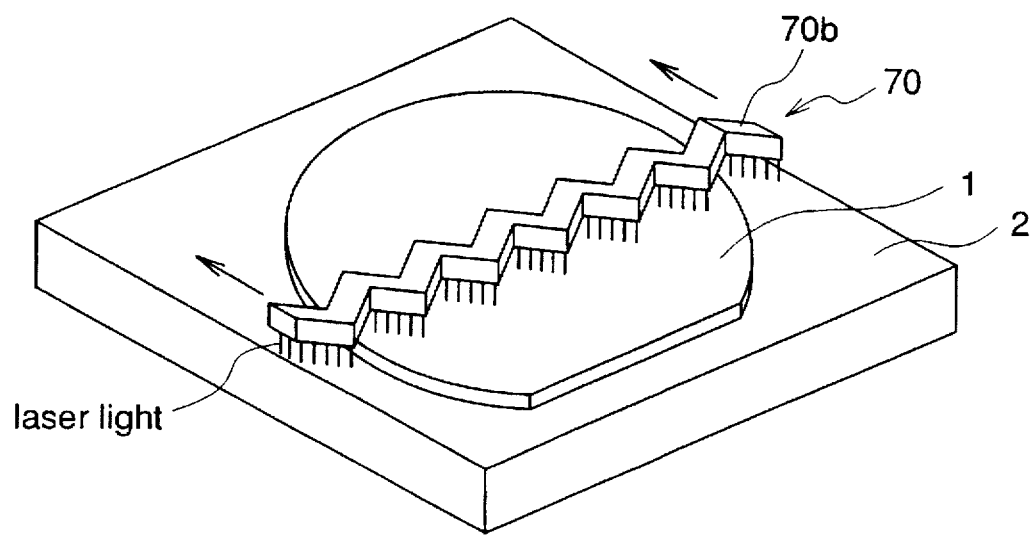
FIG. 15(a) is a perspective view illustrating an apparatus for zone-melting recrystallization of a semiconductor layer in accordance with an eighth embodiment of the present invention.
FIG. 15(b) is a schematic view illustrating a semiconductor laser array included in the apparatus.
Figure 15:
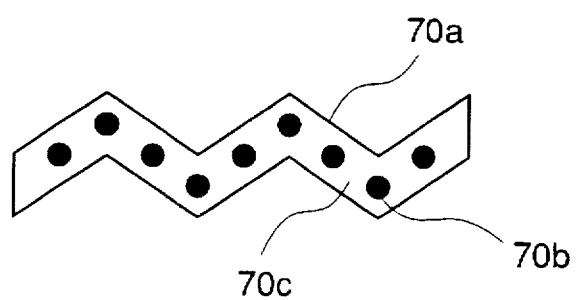

FIGS. 15(a)–15(b) are diagrams illustrating an apparatus for zone-melting recrystallization of a semiconductor layer in accordance with an eighth embodiment of the present invention. More specifically, FIG. 15(a) is a perspective view of the apparatus, and FIG. 15(b) is a schematic view of a semiconductor laser array as a main constituent of the apparatus. In the figures, the same reference numerals as in FIG. 18 designate the same or corresponding parts. Reference numeral 70 designates a laser array comprising a zigzag strip substrate 70a and a plurality of semiconductor laser chips 70b arranged in a zigzag line on a longitudinal surface 70c of the zigzag substrate 70a.

The zone-melting recrystallization method according to this eighth embodiment is fundamentally identical to the prior art method shown in FIG. 18 except that the semiconductor laser array 70 is used in place of the strip carbon heater 3 and the semiconductor laser array 70 is positioned above the semiconductor wafer 1 and moved across the semiconductor wafer at a uniform rate. The semiconductor laser chips 70b emit laser beams of the same intensity and perpendicular to the surface of the semiconductor wafer 1.

In this eighth embodiment, with the movement of the semiconductor laser array 70, a zigzag line-shaped molten zone advances in the semiconductor layer 5 on the semiconductor wafer 1, and the liquid-solid interface produced in the semiconductor layer 5 during the recrystallization of the molten zone has a periodic concave-covex form. Therefore, the same effects as described in the fourth embodiment are achieved.

While in this eighth embodiment an semiconductor laser array on a zigzag line-shaped substrate is employed, an semiconductor laser array in which a plurality of laser chips are arranged in a zigzag pattern on a longitudinal surface of a straight strip substrate a little wider than the zigzag substrate may be employed with the same effects as described above.

[Embodiment 9]

Figure 16:
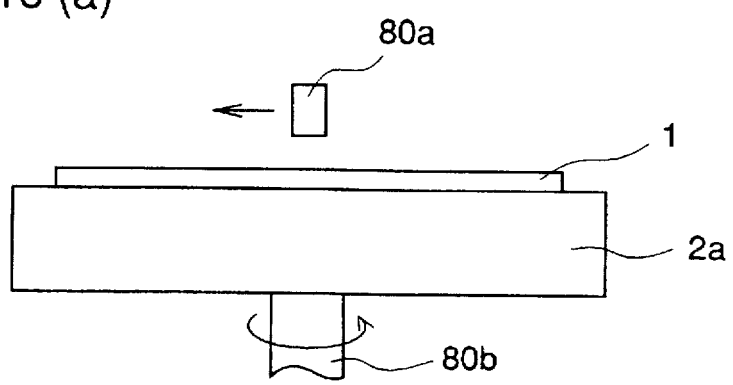
FIGS. 16(a) and 16(b) are a side view and a plan view illustrating an apparatus for zone-melting recrystallization of a semiconductor layer in accordance with an eighth embodiment of the present invention.
Figure 16:
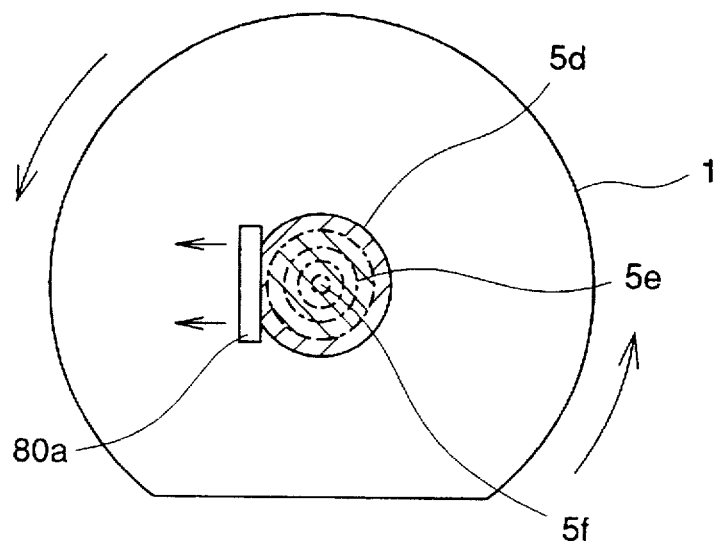
Figure 17:
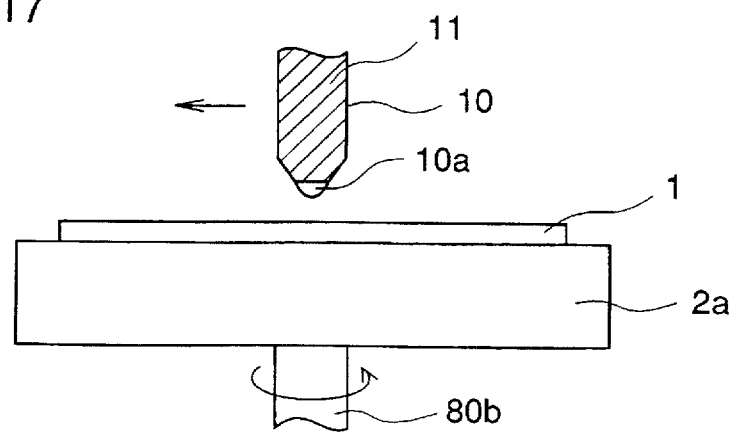
FIG. 17 is a side view illustrating an apparatus for zone-melting recrystallization in accordance with a modification of the eighth embodiment of the invention.

FIGS. 16(a)–16(b) are a side view and a plan view, respectively, illustrating an apparatus for zone-melting recrystallization of a semiconductor layer in accordance with a ninth embodiment of the present invention. In the figures, the same reference numerals as in FIG. 18 designate the same or corresponding parts. Reference numeral 80a designates a short strip carbon heater, numeral 2a designates a plate carbon heater on which a semiconductor wafer 1 is mounted, and numeral 80b designates a shaft fixed to the center of the lower surface of the plate carbon heater 2a. The shaft 80b is connected to a shaft of a motor (not shown) and rotated by the motor. The semiconductor wafer 1 is identical to that used in the first embodiment of the invention. The

16 strip carbon heater 80a has such a short length that a melted and recrystallized region created in the semiconductor layer 5 in the semiconductor wafer 1 opposite the heater 80a is a narrow region recrystallized with a single crystalline nucleus as a seed crystal.

A description is given of the operation.

Initially, the semiconductor wafer 1 is mounted on the upper surface of the plate carbon heater 2a so that the center of the wafer is positioned on the center of the heater 2a. The semiconductor wafer 1 is heated by the plate carbon heater 2a to a temperature at which the semiconductor layer 5 and the insulating film 6 included in the wafer 1 are not melted. In this state, the plate carbon heater 2a is rotated to rotate the semiconductor wafer 1 with the center point as a rotation axis, and the strip carbon heater 80a is moved from the center of the rotating semiconductor wafer 1 toward the periphery of the wafer at a uniform rate while maintaining a fixed distance from the surface of the semiconductor wafer 1, whereby the semiconductor layer 5 in the wafer 1 is melted and recrystallized.

In this zone-melting recrystallization process, initially, a small region 5f in the center of the semiconductor layer 5 in the rotating semiconductor wafer 1 is heated and melted by the shortstrip carbon heater 80a positioned above that region 5f. When the heater 80a has moved away, the region 5f is cooled and recrystallized with a single crystalline nucleus as a seed crystal. Thereafter, with the movement of the heater 80a, a region of the rotating semiconductor layer 5 under the center portion of the heater 80a is heated, melted, and recrystallized. Since regions of the semiconductor layer 5 under the opposite ends of the heater 80a are heated less than the region under the center portion of the heater 80a, these regions are not melted. In this way, the semiconductor layer 5 is gradually melted and recrystallized from the center toward the periphery, and the recrystallized region 5e is produced concentrically spreading from the center of the semiconductor layer 5. Since the zone-melting recrystallization is carried out with the small monocrystalline region 5f in the center of the semiconductor layer 5 as a seed crystal, the recrystallized region 5e inherits the crystal structure and orientation of the small monocrystalline region 5f in the center of the semiconductor layer 5 (to be exact, the crystal structure and orientation of the single crystalline nucleus), so that the recrystallized region 5e has the same crystal structure and orientation as the monocrystalline region 5f. Therefore, grain boundaries in the recrystallized region 5e are significantly reduced, resulting in a semiconductor layer wherein the grain size, i.e., the monocrystalline region, is increased as compared to that provided by the prior art method.

In place of the short-strip carbon heater 80a shown in FIG. 16(a), the heater 10 with the heat generating point 10a according to the first embodiment may be used. Also in this case, the heater 10 is moved from the center of the horizontally rotating semiconductor wafer 1 toward the periphery of the wafer at a uniform rate while maintaining a fixed distance from the surface of the wafer.

What is claimed is:

1. A method for zone-melting recrystallization of a semiconductor layer comprising:

heating a spot of a semiconductor layer; and spirally moving the heated spot relative to the semiconductor layer to melt and recrystallize the semiconductor layer, thereby producing a large-area monocrystalline region in the semiconductor layer.

2. The method of claim 1 including spirally moving the heated spot from a center of the semiconductor layer as a starting point of the spiral movement, gradually increasing the distance from the center.

3. A method for zone-melting recrystallization of a semiconductor layer comprising:

heating a linear region of a semiconductor layer so that alternating high-temperature portions and low-temperature portions are produced in a longitudinal direction of the linear region; and moving the linear heated region in a direction perpendicular to the longitudinal direction of the heated region to melt and recrystallize the semiconductor layer, thereby producing a large-area monocrystalline region in the semiconductor layer.

4. An apparatus for zone-melting recrystallization of a semiconductor layer included in a semiconductor wafer, the semiconductor wafer comprising the semiconductor layer and upper and lower insulating layers sandwiching the semiconductor layer, the apparatus comprising:

a first heater, on which the semiconductor wafer is mounted, for radiantly heating a rear surface of the semiconductor wafer to a temperature at which the semiconductor layer and the insulating layers are not melted; and a second heater for radiantly heating a front surface of the semiconductor wafer and moving across the semiconductor wafer at a uniform rate while maintaining a fixed distance from the semiconductor wafer, the second heater comprising a semiconductor laser array in which a plurality of semiconductor laser chips are arranged in a straight line in a longitudinal direction, the semiconductor laser chips emitting laser beams having different intensities to provide a sinusoidal surface temperature distribution on the semiconductor wafer.

5. An apparatus for zone-melting recrystallization of a semiconductor layer included in a semiconductor wafer, the semiconductor wafer comprising the semiconductor layer and upper and lower insulating layers sandwiching the semiconductor layer, the apparatus comprising:

a first heater, on which the semiconductor wafer is mounted, for radiantly heating a rear surface of the semiconductor wafer to a temperature at which the semiconductor layer and the insulating layers are not melted; and a second heater for radiantly heating a front surface of the semiconductor wafer and moving across the semiconductor wafer at a uniform rate while maintaining a fixed distance from the semiconductor wafer, the second heater comprising a semiconductor laser array in which a plurality of semiconductor laser chips are arranged in a straight line in a longitudinal direction, the semiconductor laser chips emitting laser beams in different directions to provide a sinusoidal surface temperature distribution on the semiconductor wafer.

6. An apparatus for zone-melting recrystallization of a semiconductor layer included in a semiconductor wafer, the semiconductor wafer comprising a semiconductor layer and upper and lower insulating layers sandwiching the semiconductor layer, the apparatus comprising:

a first heater, on which the semiconductor wafer is mounted, for radiantly heating a rear surface of the semiconductor wafer to a temperature at which the semiconductor layer and the insulating layers are not melted; and a second heater for radiantly heating a front surface of the semiconductor wafer and moving across the semiconductor wafer at a uniform rate while maintaining a fixed distance from the semiconductor wafer, the second heater comprising a strip carbon heater having a periodic concave-convex thickness variation in a longitudinal direction providing alternating high-temperature regions and low-temperature regions in the semiconductor layer.

7. An apparatus for zone-melting recrystallization of a semiconductor layer included in a semiconductor wafer, the semiconductor wafer comprising a semiconductor layer and upper and lower insulating layers sandwiching the semiconductor layer, the apparatus comprising:

a first heater, on which the semiconductor wafer is mounted, for radiantly heating a rear surface of the semiconductor wafer to a temperature at which the semiconductor layer and the insulating layers are not melted; and a second heater for radiantly heating a front surface of the semiconductor wafer and moving across the semiconductor wafer at a uniform rate while maintaining a fixed distance from the semiconductor wafer, the second heater comprising a strip carbon heater that includes a plurality of island regions, each island region having a length, the island regions being arranged at a fixed interval in a longitudinal direction so that the strip heater has a periodic variation in caloric power in the longitudinal direction produced by a first current flowing through the heater in the longitudinal direction and second currents flowing between adjacent pairs of the island regions and providing alternating high-temperature regions and low-temperature regions in the semiconductor layer.

8. An apparatus for zone-melting recrystallization of a semiconductor layer included in a semiconductor wafer, the semiconductor wafer comprising a semiconductor layer and upper and lower insulating layers sandwiching the semiconductor layer, the apparatus comprising:

a first heater, on which the semiconductor wafer is mounted, for radiantly heating a rear surface of the semiconductor wafer to a temperature at which the semiconductor layer and the insulating layers are not melted; and a second heater for radiantly heating a front surface of the semiconductor wafer and moving across the semiconductor wafer at a uniform rate while maintaining a fixed distance from the semiconductor wafer, the second heater comprising a strip carbon heater having a longitudinal surface and a plurality of heat insulating members arranged on the longitudinal surfaces of the strip carbon heater at a uniform interval, the heat insulating members providing alternating high-temperature regions and low-temperature regions in the semiconductor layer.

9. A method for zone-melting recrystallization of a semiconductor layer comprising:

heating a linear region of the semiconductor layer, the linear region having a longitudinal side of zigzag or sinusoidal form; and moving the linear heated region in a direction perpendicular to the longitudinal direction of the heated region, thereby producing a large-area monocrystalline region in the semiconductor layer.

10. An apparatus for zone-melting recrystallization of a semiconductor layer included in a semiconductor wafer, the semiconductor wafer comprising the semiconductor layer and upper and lower insulating layers sandwiching the semiconductor layer, the apparatus comprising:

a first heater, on which the semiconductor wafer is mounted, for radiantly heating a rear surface of the semiconductor wafer to a temperature at which the semiconductor layer and the insulating layers are not melted; and a second heater for radiantly heating a front surface of the semiconductor wafer and moving across the semiconductor wafer at a uniform rate while maintaining a fixed distance from the semiconductor wafer, the second heater comprising a strip carbon heater having a longitudinal surface with a zigzag or sinusoidal pattern.

11. A method for zone-melting recrystallization of a semiconductor layer comprising:

heating a linear region of the semiconductor layer, the region having a zigzag or sinusoidal form; and moving the linear heated region in direction perpendicular to a longitudinal direction of the heated region to melt and recrystallize the semiconductor layer, thereby producing a large-area monocrystalline region in the semiconductor layer.

12. An apparatus for zone-melting recrystallization of a semiconductor layer included in a semiconductor wafer, the semiconductor wafer comprising a semiconductor layer and upper and lower insulating layers sandwiching the semiconductor layer, the apparatus comprising:

a first heater, on which the semiconductor wafer is mounted, for radiantly heating a rear surface of the semiconductor wafer to a temperature at which the semiconductor layer and the insulating layers are not melted; and a second heater for radiantly heating a front surface of the semiconductor wafer and moving across the semiconductor wafer at a uniform rate while maintaining a fixed distance from the semiconductor wafer, the second heater comprising a semiconductor laser array including a plurality of semiconductor chips arranged along a zigzag or sinusoidal line.

13. A method for zone-melting recrystallization of a semiconductor layer comprising:

heating a spot or a linear region of the semiconductor layer, the linear region having such a short length that a melted and recrystallized region created in the semiconductor layer upon movement of the heated region is a narrow region recrystallized with a single crystalline nucleus as a seed crystal; and rotating the semiconductor layer with a center point thereof as an axis of the rotation so that the heated region is moved from the center point of the rotating semiconductor layer outward to melt and recrystallize the semiconductor layer, thereby producing a large-area monocrystalline region in the semiconductor layer.

14. An apparatus for zone-melting recrystallization of a semiconductor layer included in a semiconductor wafer, the semiconductor wafer comprising the semiconductor layer and upper and lower insulating layers sandwiching the semiconductor layer, the apparatus comprising:

a first heater, on which the semiconductor wafer is mounted, for radiantly heating a rear surface of the semiconductor wafer to a temperature at which the semiconductor layer and the insulating layers are not melted, said first heater rotating to rotate the semiconductor wafer; and a second heater for radiantly heating a front surface of the semiconductor wafer, the second heater having a heat generating point or a heat generating linear portion that produces a heated spot in the semiconductor layer and moves from a center point of the rotating semiconductor layer outward at a uniform rate while maintaining a fixed distance from the semiconductor wafer, thereby producing a large-area monocrystalline region in the semiconductor layer.

* * * * *